United States Patent
Ino et al.

(10) Patent No.: US 10,923,500 B2
(45) Date of Patent: Feb. 16, 2021

(54) MEMORY DEVICE

(71) Applicant: Toshiba Memory Corporation, Tokyo (JP)

(72) Inventors: Tsunehiro Ino, Fujisawa Kanagawa (JP); Yuuichi Kamimuta, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 7 days.

(21) Appl. No.: 16/360,932

(22) Filed: Mar. 21, 2019

(65) Prior Publication Data

US 2020/0091160 A1    Mar. 19, 2020

(30) Foreign Application Priority Data

Sep. 19, 2018  (JP) ................... 2018-175448

(51) Int. Cl.
*H01L 27/1159* (2017.01)
*H01L 27/11597* (2017.01)
*H01L 27/11507* (2017.01)
*H01L 27/24* (2006.01)

(52) U.S. Cl.
CPC .... *H01L 27/1159* (2013.01); *H01L 27/11507* (2013.01); *H01L 27/11597* (2013.01); *H01L 27/2463* (2013.01)

(58) Field of Classification Search
CPC .................. H01L 27/1159; H01L 27/11507
See application file for complete search history.

(56) References Cited

U.S. PATENT DOCUMENTS

| | | | | |
|---|---|---|---|---|
| 7,541,424 B2 * | 6/2009 | Jeong | ................... | C08G 61/12 257/40 |
| 7,947,582 B2 * | 5/2011 | Hautala | ............... | H01L 29/7881 438/515 |
| 8,779,486 B2 | 7/2014 | Fujimori et al. | | |
| 8,952,482 B2 | 2/2015 | Tanzawa | | |
| 9,053,801 B2 * | 6/2015 | Sandhu | ............... | H01L 45/1616 |
| 9,171,850 B2 | 10/2015 | Fujimori et al. | | |
| 9,343,479 B2 | 5/2016 | Tanzawa | | |
| 9,691,973 B2 * | 6/2017 | Ino | ......................... | G11C 11/22 |

(Continued)

FOREIGN PATENT DOCUMENTS

| | | | |
|---|---|---|---|
| JP | 2011-195396 A | 10/2011 | |
| JP | 2012-256702 A | 12/2012 | |

(Continued)

OTHER PUBLICATIONS

A. Konishi et al., Analysis of polarization reversal path of κ-Al2O3 type ferroelectrics by unified principle calculation, Japan Fine Ceramics Center, R-11 (2016) (Year: 2016).*

(Continued)

*Primary Examiner* — Victoria K. Hall
(74) *Attorney, Agent, or Firm* — Foley & Lardner LLP

(57) ABSTRACT

A memory device according to an embodiment includes a first conductive layer, a second conductive layer, and a first layer provided between the first conductive layer and the second conductive layer and containing aluminum oxide that contains at least one first element selected from the group consisting of magnesium (Mg), silicon (Si), hafnium (Hf), tungsten (W), and ruthenium (Ru), and the aluminum oxide is a ferroelectric.

21 Claims, 6 Drawing Sheets

(56) References Cited

U.S. PATENT DOCUMENTS

| | | | |
|---|---|---|---|
| 9,903,898 B2* | 2/2018 | Kijima | H01L 41/257 |
| 10,096,619 B2 | 10/2018 | Ino et al. | |
| 10,210,921 B1* | 2/2019 | Hwang | G11C 11/2255 |
| 10,446,749 B1* | 10/2019 | Yoshimura | G11C 13/0028 |
| 10,475,924 B2* | 11/2019 | Yoo | H01L 45/1233 |
| 10,717,677 B2* | 7/2020 | Watanabe | B32B 18/00 |
| 2004/0115881 A1* | 6/2004 | Choi | H01L 28/75 438/240 |
| 2006/0201415 A1* | 9/2006 | Ong | H01L 27/11502 117/95 |
| 2006/0214204 A1* | 9/2006 | Yoo | H01L 28/55 257/295 |
| 2006/0263909 A1* | 11/2006 | Choi | H01L 28/75 438/3 |
| 2006/0273366 A1* | 12/2006 | Ko | H01L 28/65 257/295 |
| 2007/0045689 A1* | 3/2007 | Lim | H01L 28/65 257/295 |
| 2008/0199975 A1* | 8/2008 | Park | H01L 29/40117 438/3 |
| 2009/0061538 A1* | 3/2009 | Heo | H01L 21/31691 438/3 |
| 2010/0015729 A1* | 1/2010 | Choi | H01L 21/3105 438/3 |
| 2012/0313218 A1 | 12/2012 | Fujimori et al. | |
| 2014/0070289 A1* | 3/2014 | Tanaka | H01L 29/40111 257/295 |
| 2014/0284766 A1 | 9/2014 | Fujimori et al. | |
| 2015/0070964 A1* | 3/2015 | Yamada | H01L 21/84 365/145 |
| 2016/0005961 A1* | 1/2016 | Ino | H01L 45/06 257/4 |
| 2016/0099354 A1* | 4/2016 | Ramaswamy | H01L 29/513 257/295 |
| 2016/0181259 A1* | 6/2016 | Van Houdt | H01L 29/78391 365/145 |
| 2016/0308070 A1* | 10/2016 | Chang | H01L 29/7845 |
| 2016/0372478 A1* | 12/2016 | Ino | H01L 28/40 |
| 2018/0006130 A1 | 1/2018 | Sakai et al. | |
| 2018/0082750 A1 | 3/2018 | Ikeda et al. | |
| 2018/0182769 A1* | 6/2018 | Cheng | G11C 11/2273 |
| 2018/0190338 A1* | 7/2018 | Li | H01L 29/66643 |
| 2018/0230020 A1* | 8/2018 | Matsushima | C04B 35/632 |
| 2018/0244579 A1* | 8/2018 | Watanabe | C04B 35/6262 |
| 2018/0366477 A1* | 12/2018 | Liu | H01L 28/40 |
| 2019/0393355 A1* | 12/2019 | Yoo | H01L 29/518 |
| 2020/0035704 A1* | 1/2020 | Kinney | H01L 27/1159 |
| 2020/0227515 A1* | 7/2020 | Shifren | H01L 29/6684 |
| 2020/0227727 A1* | 7/2020 | Li | H01M 4/362 |
| 2020/0235221 A1* | 7/2020 | Sharma | H01L 21/823857 |

FOREIGN PATENT DOCUMENTS

| | | |
|---|---|---|
| JP | 6096902 B2 | 3/2017 |
| JP | 2018-049879 A | 3/2018 |
| WO | WO-2015/141626 A1 | 9/2015 |

OTHER PUBLICATIONS

C. Ragupathi et al., Combustion synthesis, structure, magnetic and optical properties of cobalt aluminate spinel nanocrystals, May 10, 2014, Ceramics Int'l, vol. 40, pp. 13067-13074. (Year: 2014).*

S. Zhang et al., Electrical Spin Injection and Detection in Silicon Nanowires through Oxide Tunnel Barriers, Jan. 16, 2013, Nano Letters, vol. 13, pp. 430-435. (Year: 2013).*

R. Padam et al., Evolution of ferrimagnetism in Co(Cr1—xAlx)2O4 (x=0.0-1.0), Feb. 19, 2016, J. Magnetism & Magnetic Materials, vol. 418, pp. 231-235. (Year: 2016).*

Danchevskaya et al., Synthesis and doping of fine-crystalline corundum in sub- and supercritical conditions, 2008, J. Physics: Conference Series, vol. 121, No. 082001, pp. 1-5. (Year: 2008).*

Y. Zhang et al., Metallic conduction and ferromagnetism in MAl2O4/SrTiO3 spinel/perovskite heterostructures (M=Fe, Co, Ni), Dec. 28, 2018, Applied Physics Letters, vol. 113, No. 261603-1 to 261603-5. (Year: 2018).*

Y. Hamasaki et al., Crystal structure and magnetism in k-Al2O3-type AlxFe2—xO3 films on SrTiO3(111), Jul. 5, 2017, J. Applied Physics, vol. 122, pp. 015301-1 to 015301-7 (Year: 2017).*

LinguaLinx Language Solutions, Inc., English Translation, F. Zhang, Magnetic and Structural Properties of Room-Temperature Ferromagnetic Al2O3:Mn, translation date: Sep. 2020, all pages. (Year: 2020).*

S. Nakamura et al., Transport and Magnetic Properties of Ferromagnetic Co—Al—O and Fe—Al—O Granular Films, 2011, J. Physics: Conference Series, vol. 266, No. 012019, pp. 1-5. (Year: 2011).*

M. Bekheet et al., Ferrimagnetism in manganese-rich gallium and aluminium spinels due to mixed valence Mn2+—Mn3+ states, Jan. 22, 2018, Dalton Transactions, vol. 47, pp. 2727-2738. (Year: 2018).*

S. Nakamura et al., Temperature Dependence of the Coercive Force of Ferromagnetic Tm—Al—O (Tm=Fe, Co) Granular Films, Aug. 2013, J. Korean Physical Society, vol. 63, No. 3, pp. 773-777. (Year: 2013).*

F. Zhang, Magnetic and Structural Properties of Room-Temperature Ferromagnetic Al2O3, Dec. 2005, Chinese J. Semiconductors, vol. 26, No. 12, 2390-2395. (Year: 2005).*

A. Timofeev et al., Investigations of the magnetic properties of the granular system Co0.6(Al2On)0.4 possessing isotropic positive magnetoresistance, Nov. 2007, Low Temperature Physics, vol. 33, No. 11, 974-986. (Year: 2007).*

Y. Nakamura et al., Structure and Magnetic Properties of Quenched (MnxAl1—x)3O4 Spinels and Hausmannites, Nov. 1995, IEEE Transactions on Magnetics, vol. 31, No. 6, 4154-4156. (Year: 1995).*

A. Yoshihara et al., Spin Wave and Transport Properties in Ferromagnetic Co—Al—O and Fe—Al—O Granular Films: A Brillouin Scattering Study, Sep. 2008, vol. 77, No. 9, 094704-1 to 094704-6. (Year: 2008).*

"Böscke et al., Ferroelectricity in hafnium oxide thin films," Applied Physics Letters 99, 102903 (2011).

Böscke et al., "Phase transitions in ferroelectric silicon doped hafnium oxide," Applied Physics Letters 99, 112904 (2011).

"Liu et al., Space-Group Determination and Structure Model for $_K$-Al2O3 by Convergent-Beam Electron Diffraction (CBED)," Acta. Cryst. (1991) B47, 425-433.

"Mousavi et al., Calculation of the Structural, Electrical, and Optical Properties of $_K$-Al$_2$O$_3$ by Density Functional Theory," Chinese Journal of Physics, vol. 46, No. 2 (2008).

"Müller et al., Ferroelectric Zr0.5Hf0.5O2 thin films for nonvolatile memory applications," Applied Physics Letters 99, 112901 (2011).

"Paglia et al., A computational investigation of the structure of k-alumina using interatomic potentials," Journal of Materials Chemistry, (2001) 11, 3310-3316.

"Santos et al., Standard Transition Aluminas. Electron Microscopy Studies," Materials Research, vol. 3, No. 4, 104-114, (2000).

"Yourdshahyan et al. Theoretical Structure Determination of a Complex Material: k-Al$_2$O$_3$," Journal of the American Ceramic Society, vol. 82 No. 6, 1365-80 (1999).

Katayama et al., "Chemical tuning of room-temperature ferrimagnetism and ferroelectricity in $_\epsilon$-Fe$_2$O$_3$-type multiferroic oxide thin films," Journal of Materials Chemistry C, (2017) 5, 12597-12601 and Supporting Information Electronic Supplementary Material (2017).

Konishi et al., "Analysis of polarization reversal path of k-Al$_2$O$_3$ type ferroelectrics by unified principle calculation" Japan Fine Ceramics Center, R-11, (2016).

Ollivier et al., "Crystal structure of k-alumina: an X-ray powder diffraction, TEM and NMR study," J. Mater. Chem., 1997, 7(6), 1049-1056.

Predel, "Phase Equilibria, Crystallographic and Thermodynamic Data of Binary Alloys," Al—O (Aluminum-Oxygen), Supplement to No. A31, Landolt-Bornstein New Series IV/12A, Supplement to IV/5A (2006).

(56) References Cited

OTHER PUBLICATIONS

JCPDS (Joint Committee on Powder Diffraction Standards) data number of 00-004-0878. Related to H.C. Stumpf et al., Industrial & Engineering Chemistry, vol. 42(7), 1950, pp. 1398-1403.

JCPDS (Joint Committee on Powder Diffraction Standards) data number of 01-088-0107. Related to Ollivier et al., "Crystal structure of k-alumina: an X-ray powder diffraction, TEM and NMR study," J. Mater. Chem., 1997, 7(6), 1049-1056.

Takashima et al., "An Embedded DRAM Technology for High-Performance NAND Flash Memories," IEEE ISSCC 2011, Session 28, 504-505.

Vali et al., "First-principles study of structural, dynamical, and dielectric properties of $A-La_2O_3$", Computational Materials Science 31 (2004) 125-130.

Wriedt, "The Al—O (Aluminum-Oxygen) System", Bulletin of Alloy Phase Diagrams, vol. 6, No. 6 (1985).

* cited by examiner

MEMORY DEVICE

CROSS-REFERENCE TO RELATED APPLICATION

This application is based upon and claims the benefit of priority from Japanese Patent Application No. 2018-175448, filed on Sep. 19, 2018, the entire contents of which are incorporated herein by reference.

FIELD

Embodiments described herein relate generally to a memory device.

BACKGROUND

A memory device using a ferroelectric has attracted attention as a nonvolatile memory device. For example, there is a three-terminal type memory device having a metal ferroelectrics semiconductor (MFS) structure in which a gate insulating layer of a transistor is a ferroelectric layer. Also, there is a two-terminal type memory device in which a ferroelectric layer is provided between two electrodes like a ferroelectric tunnel junction (FTJ) memory, for example.

In the memory device using the ferroelectric, data is written to a memory cell using polarization inversion of the ferroelectric. The polarization inversion is generated by applying an electric field from the outside to the ferroelectric. The strength of the electric field where the inversion is generated is called a "coercive electric field".

DETAILED DESCRIPTION

Figure 1:
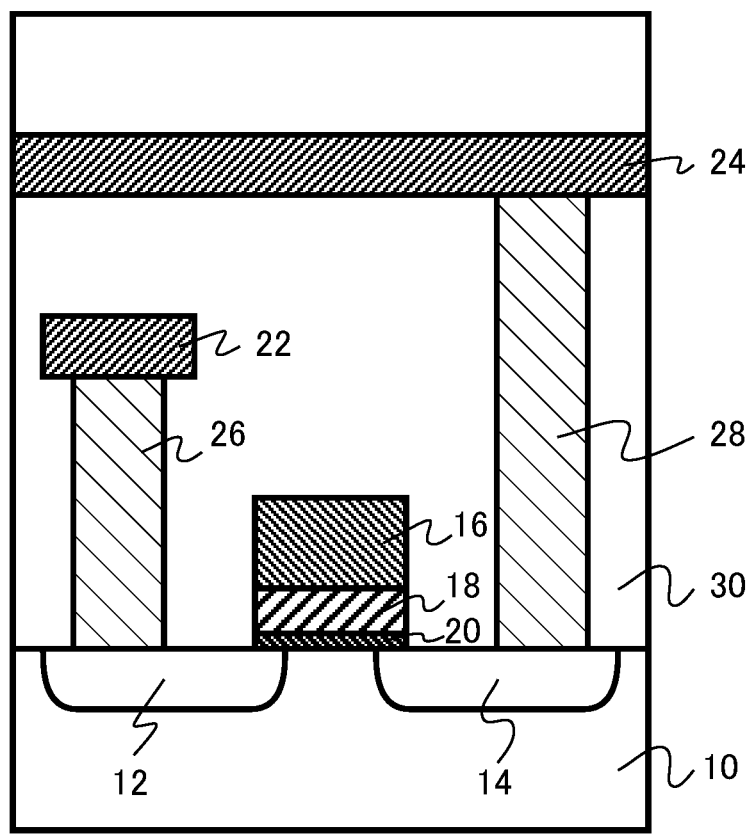
FIG. 1 is a schematic cross-sectional view of a memory device according to a first embodiment.

A memory device according to an embodiment includes a first conductive layer; a second conductive layer; and a first layer provided between the first conductive layer and the second conductive layer, the first layer including aluminum oxide, the aluminum oxide containing at least one first element selected from the group consisting of magnesium (Mg), silicon (Si), hafnium (Hf), tungsten (W), and ruthenium (Ru), and the aluminum oxide being a ferroelectric.

In the present specification, the same or similar members are denoted by the same reference numerals and redundant explanation may be omitted.

In the present specification, "ferroelectric" means a substance in which spontaneous polarization is generated even when an electric field is not applied from the outside and the polarization is inverted when the electric field is applied from the outside. In addition, in the present specification, "paraelectric" means a substance in which the polarization is generated when the electric field is applied and the polarization disappears when the electric field is removed.

The qualitative analysis and the quantitative analysis of a chemical composition of members constituting the memory device in the present specification can be carried out by secondary ion mass spectroscopy (SIMS), energy dispersive X-ray spectroscopy (EDX), electron energy-loss spectroscopy (EELS), Rutherford backscattering spectrometry (RBS), atom probe tomography, or the like, for example. In addition, for measurement of the thickness of the members constituting the memory device, a distance between the members, and the like, for example, a transmission electron microscope (TEM) can be used. For identification of crystal structures of the members constituting the memory device, for example, in addition to the TEM, convergent-beam electron diffraction (CBED), an X-ray diffraction method using free electron lasers such as radiated light and spring-8 angstrom compact free electron laser (SACLA), Fourier transform infrared spectroscopy (FT-IR), and X-ray photoelectron spectroscopy (XPS) can be used.

Hereinafter, embodiments of the present disclosure will be described with reference to the drawings.

First Embodiment

A memory device according to a first embodiment includes a first conductive layer, a second conductive layer, and a first layer provided between the first conductive layer and the second conductive layer and containing aluminum oxide that contains at least one first element selected from the group consisting of magnesium (Mg), silicon (Si), hafnium (Hf), tungsten (W), and ruthenium (Ru) and is a ferroelectric.

FIG. 1 is a schematic cross-sectional view of the semiconductor memory device according to the first embodiment. The memory device according to the first embodiment is a nonvolatile semiconductor memory device. The memory device according to the first embodiment is a one-transistor type (1T type) memory device including a transistor having an MFS structure. The transistor having the MFS structure constitutes a memory cell. The term MFS structure used here does not exclude a structure in which an insulating film is interposed, such as a metal ferroelectric insulator semiconductor (MFIS) structure and a metal insulator ferroelectric insulator semiconductor (MIFIS) structure, and means a structure in which a ferroelectric applies modulation to a channel of the transistor.

The memory device according to the first embodiment includes a semiconductor layer 10 (first conductive layer), a source region 12, a drain region 14, a gate electrode 16 (second conductive layer), a ferroelectric layer 18 (first layer), an interface layer 20 (second layer), a source line 22, a bit line 24, a first contact plug 26, a second contact plug 28, and an interlayer insulating layer 30.

The semiconductor layer 10 is, for example, single crystal silicon.

The source region 12 is provided in the semiconductor layer 10. The source region 12 is an n-type impurity region. The drain region 14 is provided in the semiconductor layer 10. The drain region 14 is an n-type impurity region.

The gate electrode 16 is a metal or a semiconductor. The gate electrode 16 is, for example, titanium nitride. The gate electrode 16 is, for example, polycrystalline silicon containing n-type impurities or p-type impurities. The gate electrode 16 functions as a word line of the memory device.

The ferroelectric layer 18 is provided between the semiconductor layer 10 and the gate electrode 16. The ferroelectric layer 18 functions as a part of a gate insulating layer.

The ferroelectric layer 18 contains ferroelectric aluminum oxide. The ferroelectric layer 18 contains ferroelectric aluminum oxide as a main component.

Aluminum oxide contains κ (kappa)-aluminum oxide. The inventor has found that the κ-aluminum oxide is the ferroelectric, by first principle calculation using a projector augmented wave (PAW) potential at a plane wave basis.

The κ-aluminum oxide has an orthorhombic crystal structure. The κ-aluminum oxide has a crystal structure of a space group $Pna2_1$ (space group number 33). The crystal structure of the aluminum oxide contained in the ferroelectric layer 18 can be determined by an X-ray diffraction method using radiated light, Fourier transform infrared spectroscopy, an electron diffraction method, an analysis method by a Fourier transform of photos obtained by photographing lattice fringes by a transmission electron microscope, and the like.

In a thin film of the κ-aluminum oxide, an X-ray diffraction pattern obtained by an X-ray diffraction method in which a wavelength A of non-polarized X-rays is $\lambda=1.420$ nm (a wavelength of Kα ray of copper) has a first peak at $2\theta=35°\pm1°$, a second peak at $2\theta=43°\pm1°$, and a third peak at $2\theta=32°\pm1°$. Further, the X-ray diffraction pattern has peaks at $2\theta=15°\pm1°$, $2\theta=20°\pm1°$, $2\theta=29°\pm1°$, $2\theta=37°\pm1°$, $2\theta=38°\pm1°$, $2\theta=40°\pm1°$, $2\theta=47°\pm1°$, $2\theta=52°\pm1°$, $2\theta=55°\pm1°$, $2\theta=57°\pm1°$, $2\theta=60°\pm1°$, $2\theta=62°\pm1°$, and the like, respectively. The relative intensity of the first peak, the second peak, and the third peak may change depending on an orientation state of a crystal, a wavelength of incident X-rays, and a shape of a sample.

The κ-aluminum oxide may be a single crystal or a polycrystalline. A ferroelectric crystal made of the κ-aluminum oxide may be non-oriented, but it is more preferable that it has orientation. In the κ-aluminum oxide, a c-axis to be a ferroelectric spontaneous polarization axis is preferably oriented in a direction directing from a gate electrode to a channel, that is, a film thickness direction, because a coercive electric field can be increased.

In addition, in the κ-aluminum oxide, an absorption peak corresponding to a soft mode of the ferroelectric exists at 131.5 $cm^{-1}$ of an infrared absorption spectrum obtained by infrared spectroscopy. However, as the infrared absorption spectrum, peak intensities in the vicinity of 160 $cm^{-1}\pm15$ $cm^{-1}$, 280 $cm^{-1}\pm15$ $cm^{-1}$, 340 $cm^{-1}\pm15$ $cm^{-1}$, 380 $cm^{-1}\pm15$ $cm^{-1}$, 480 $cm^{-1}\pm15$ $cm^{-1}$, 520 $cm^{-1}\pm15$ $cm^{-1}$, 540 $cm^{-1}\pm15$ $cm^{-1}$, 570 $cm^{-1}\pm15$ $cm^{-1}$, 600 $cm^{-1}\pm15$ $cm^{-1}$, 680 $cm^{-1}\pm15$ $cm^{-1}$, 760 $cm^{-1}\pm15$ $cm^{-1}$, 780 $cm^{-1}\pm15$ $cm^{-1}$, and 800 $cm^{-1}\pm15$ $cm^{-1}$ are stronger. Particularly, intensities of the peaks in the vicinity of 540 $cm^{-1}$ to 600 $cm^{-1}$ and 340 $cm^{-1}$ to 380 $cm^{-1}$ are strong.

The aluminum oxide of the ferroelectric layer 18 contains at least one first element selected from the group consisting of magnesium (Mg), silicon (Si), hafnium (Hf), tungsten (W), and ruthenium (Ru). The content of the first element in the aluminum oxide is, for example, 1 atomic percent to 9 atomic percent.

The aluminum oxide of the ferroelectric layer 18 contains at least one second element selected from the group consisting of manganese (Mn), chromium (Cr), vanadium (V) and cobalt (Co), for example. The content of the second element in the aluminum oxide is, for example, 1 atomic percent to 10 atomic percent.

The aluminum oxide of the ferroelectric layer 18 contains at least one third element selected from the group consisting of sulfur (S), chlorine (Cl), carbon (C), and nitrogen (N), for example. The content of the third element in the aluminum oxide is, for example, 1 atomic percent to 5 atomic percent.

In the κ-aluminum oxide of the ferroelectric layer 18, for example, an a-axis length and a b-axis length are 97% to 99.5% of a standard axis length. Here, the standard axis length is, for example, an a-axis length and a b-axis length of κ-aluminum oxide described in a database of ICDD (International Center for Diffraction Data).

In the κ-aluminum oxide of the ferroelectric layer 18, for example, a c-axis to be a polarization direction of the ferroelectric is oriented in a thickness direction of the ferroelectric layer 18. In other words, in the κ-aluminum oxide of the ferroelectric layer 18, for example, the c-axis to be the polarization direction of the ferroelectric is oriented in the direction directing from the semiconductor layer 10 to the gate electrode 16. The fact that the c-axis to be the polarization direction of the ferroelectric is oriented in the direction directing from the semiconductor layer 10 to the gate electrode 16 means that a c-axis direction of the κ-aluminum oxide in the ferroelectric layer 18 is within a range of $\pm10°$ with respect to the direction directing from the semiconductor layer 10 to the gate electrode 16, for example. These c-axis and spontaneous polarization direction can be defined by XRD or cross sectional TEM analysis.

In the case where the c-axis direction of a plurality of crystal grains of the κ-aluminum oxide varies, for example, it can be determined on the basis of whether or not a median value of a distribution of a value of an angle formed by the c-axis direction of the plurality of crystal grains and the direction directing from the semiconductor layer 10 to the gate electrode 16 is within a range of $\pm10°$.

The thickness of the ferroelectric layer 18 is, for example, more than or equal to 1 nm and less than or equal to 15 nm.

The interface layer 20 is provided between the semiconductor layer 10 and the ferroelectric layer 18. The interface layer 20 functions as a part of the gate insulating layer. The interface layer 20 includes a paraelectric. The interface layer 20 has a function of reducing an interface state between the interface layer 20 and the semiconductor layer 10.

The interface layer 20 is, for example, at least one of oxide and oxynitride. The interface layer 20 is, for example, silicon oxide, silicon oxynitride, aluminum oxynitride, or a mixture of silicon oxynitride and aluminum oxynitride.

Also, it is possible to have a structure in which the interface layer 20 is omitted.

The source line 22 is electrically connected to the source region 12 via the first contact plug 26. The bit line 24 is electrically connected to the drain region 14 via the second contact plug 28. The source line 22, the bit line 24, the first contact plug 26, and the second contact plug 28 are formed of a conductive metal or a metal compound, for example.

The interlayer insulating layer 30 is provided to electrically isolate the semiconductor layer 10, the gate electrode 16, the source line 22, the bit line 24, the first contact plug 26, and the second contact plug 28. The interlayer insulating layer 30 is, for example, silicon oxide.

The memory cell of the memory device includes the semiconductor layer 10, the ferroelectric layer 18, and the gate electrode 16.

At the time of writing, the memory device changes the polarization direction of the ferroelectric layer 18 by applying a voltage between the semiconductor layer 10 and the gate electrode 16 to be the word line. At the time of reading, the memory device determines data stored by a value of a current flowing between the source line 22 and the bit line 24, that is, an on current value of the transistor of the memory cell.

The memory device controls the polarization state of the ferroelectric included in the ferroelectric layer 18 by the voltage applied between the gate electrode 16 and the semiconductor layer 10. Depending on the polarization state of the ferroelectric layer 18, a threshold voltage of the transistor of the memory cell changes. The threshold voltage of the transistor of the memory cell changes, so that the on current of the transistor of the memory cell changes.

For example, if a state where the threshold voltage is high and the on current is low is defined as data "0" and a state where the threshold voltage is low and the on current is high is defined as data "1", the memory cell can store 1-bit data of "0" and "1". Further, for example, by controlling the voltage applied to the gate electrode 16 so that the ferroelectric maintains four or more polarization states having different levels, it is possible to hold a plurality of threshold voltages in the transistor of the memory cell. By holding the plurality of threshold voltages, it is possible to realize multi-leveling in which a plurality of bits of data are stored in the memory cell.

In FIG. 1, the case where one memory cell exists between the source line 22 and the bit line 24 is exemplified. However, for example, a plurality of memory cells are connected in series between the source line 22 and the bit line 24, so that it is possible to form a NAND string of a NAND type flash memory.

Next, an example of a method of manufacturing the memory device according to the first embodiment will be described.

First, a silicon oxide layer is formed on a p-type single crystal silicon layer to be an example of the semiconductor layer 10 by a thermal oxidation method. The silicon oxide layer is an example of the interface layer 20.

Next, the ferroelectric layer 18 is formed on the interface layer 20 by a reactive sputtering method. For the target of the reactive sputtering method, aluminum oxide containing the first element is used. The target of the aluminum oxide used here is not necessarily the κ structure. The first element is at least one element selected from the group consisting of magnesium (Mg), silicon (Si), hafnium (Hf), tungsten (W), and ruthenium (Ru).

The target may contain at least one second element selected from the group consisting of manganese (Mn), chromium (Cr), vanadium (V), and cobalt (Co).

When the ferroelectric layer 18 is formed, gas containing at least one element selected from the group consisting of sulfur (S), chlorine (Cl), hydrogen (H), and carbon (C) may be flown into a chamber. Since the formation of the κ-aluminum oxide is promoted by flowing the gas, it is preferable to flow any one of the gases. Among them, gas containing the elements of chlorine, hydrogen, and carbon is preferred. Especially, gas containing all of the four elements is more preferred.

Next, for example, a titanium nitride layer is formed on the ferroelectric layer 18 by, for example, a sputtering method. The titanium nitride layer is an example of the gate electrode 16. Also, it is possible to use gate electrodes such as titanium aluminum nitride, titanium nitride silicon, tantalum nitride, tungsten nitride, ruthenium oxide, and iridium, instead of titanium nitride. Due to a difference of thermal expansion coefficients between these electrodes and aluminum oxide, in-plane compressive stress from the electrodes may be applied to a substrate.

In this case, due to the in-plane compressive stress from the electrodes, a lattice constant of the κ-aluminum oxide decreases within a range of 0.5% to 3.0% in an ab face, thereby increasing the coercive electric field in the ferroelectric characteristics. Therefore, there is an advantage that a memory window of the memory device can be widened.

Next, the gate electrode 16, the ferroelectric layer 18, and the interface layer 20 are patterned by a lithography method and a reactive ion etching method.

Next, the source region 12 and the drain region 14 are formed in the single crystal silicon layer. An n-type impurity is introduced into the single crystal silicon layer by an ion implantation method. Next, the n-type impurity is activated by a heat treatment. A temperature of the heat treatment is, for example, 800° C.

Then, a protective film for protecting the gate electrode 16, the ferroelectric layer 18, the interface layer 20, and the like, for example, a film made of silicon nitride or the like may be formed. The protective film is preferably silicon nitride formed by a known process so that the in-plane compressive stress is applied to the ferroelectric layer 18. As already described, there is an advantage that the ferroelectric characteristics are improved by applying the in-plane compressive stress to the ferroelectric.

Then, the source line 22, the bit line 24, the first contact plug 26, the second contact plug 28, and the interlayer insulating layer 30 are formed by known process technology.

By the above manufacturing method, the memory device shown in FIG. 1 is formed.

Next, functions and effects of the memory device according to the first embodiment will be described.

The one-transistor type memory cell having the MFS structure as shown in FIG. 1 is expected to be applied to a NAND type flash memory, for example. In the NAND type flash memory, multi-leveling of the memory cell is progressed to increase a memory capacity. Also, it is desired to realize multi-leveling for the memory cell having the MFS structure.

If the coercive electric field of the ferroelectric is small, for example, the polarization state disappears due to the electric field generated in the ferroelectric itself by the polarization of the ferroelectric. Therefore, if the coercive electric field of the ferroelectric is small, it becomes difficult to maintain a highly polarized state in the ferroelectric. For this reason, a large number of polarization states with different levels cannot be maintained in the ferroelectric and multi-leveling of the memory cell becomes difficult.

By increasing the coercive electric field of the ferroelectric, it is possible to stably hold a plurality of polarization states with different levels in the memory cell. Therefore, multi-leveling of the memory cell is easily realized.

In the memory device according to the first embodiment, the aluminum oxide of the ferroelectric is applied to the ferroelectric layer 18. The main crystal structure of the aluminum oxide of the ferroelectric is the κ-aluminum oxide. Here, the main crystal structure means a crystal structure having a larger existence ratio than any crystal structure of other crystal structures of aluminum oxide such as α and θ to be crystal structures other than κ. The magnitude of the existence ratio can be determined by comparing peak intensities of X-ray diffraction patterns obtained by an X-ray diffraction method, comparing absorption peak patterns obtained by infrared spectroscopy, or analyzing the pattern sequences of the atomic points by TEM photograph, for example.

By an examination using the first principle calculation of the inventor, it has been found that the κ-aluminum oxide has a large coercive electric field. That is, it has been found that the κ-aluminum oxide has a coercive electric field is about 1.5 times larger than that of hafnium oxide of the ferroelectric, which enables greater capacity.

Therefore, the κ-aluminum oxide is applied to the ferroelectric layer 18, so that multi-leveling of the memory cell which is applied is easily realized.

By the examination using the first principle calculation of the inventor, it has been found that the κ-aluminum oxide may be transferred to other crystal structure such as a (alpha)-aluminum oxide by the heat treatment at 400° C. to 500° C. If the κ-aluminum oxide is transferred to other crystal structure, ferroelectricity of the ferroelectric layer 18 is lost.

When the memory device is manufactured, the ferroelectricity of the ferroelectric layer 18 may be lost by the heat treatment after the formation of the ferroelectric layer 18. For example, the ferroelectricity of the ferroelectric layer 18 may be lost by the heat treatment of activation of the n-type impurity in the source region 12 and the drain region 14 to be performed after the formation of the ferroelectric layer 18.

By the examination using the first principle calculation of the inventor, it has been found that the κ-aluminum oxide contains at least one first element selected from the group consisting of magnesium (Mg), silicon (Si), hafnium (Hf), tungsten (W), and ruthenium (Ru), so that heat resistance of the κ-aluminum oxide is improved.

If the first element is added to the κ-aluminum oxide, an absolute value of standard free energy of formation of the κ-aluminum oxide increases and is thermally stabilized. By adding the first element, the κ-aluminum oxide is stabilized without being transferred to other crystal structure up to about 800° C. Therefore, improvement of the heat resistance of the memory cell can be realized by adding the first element.

The content of the first element in the aluminum oxide is preferably 1 atomic percent to 9 atomic percent and is more preferably 3 atomic percent to 9 atomic percent.

Preferably, the κ-aluminum oxide contains at least one second element selected from the group consisting of manganese (Mn), chromium (Cr), vanadium (V), and cobalt (Co). The κ-aluminum oxide contains the second element, so that an operation of the memory cell is further stabilized.

If a trap level of a charge exists in the ferroelectric layer 18, the charge enters and leaves the trap level, so that the operation of the memory cell becomes unstable. By adding the second element to the κ-aluminum oxide, the trap level of the charge decreases. Therefore, the operation of the memory cell is stabilized.

The content of the second element in the aluminum oxide is preferably 1 atomic percent to 10 atomic percent and is more preferably 3 atomic percent to 5 atomic percent.

The κ-aluminum oxide preferably contains at least one third element selected from the group consisting of sulfur (S), chlorine (Cl), carbon (C), and nitrogen (N). By adding the third element to the κ-aluminum oxide, reliability of the memory cell is improved. The content of the third element in the aluminum oxide is preferably 1 atomic percent to 5 atomic percent.

In the κ-aluminum oxide in the ferroelectric layer 18, the a-axis length and the b-axis length are preferably shorter than the standard axis length. By the examination using the first principle calculation of the inventor, it has been found that shortening of the a-axis length and the b-axis length increases the standard free energy of formation and improves the heat resistance of the κ-aluminum oxide.

The a-axis length and the b-axis length are preferably 97% to 99.5% of the standard axis length according to JCPDS (Joint Committee for Powder Diffraction Standards) and is more preferably 98% to 99% thereof. When the a-axis length and the b-axis length exceed the above range, sufficient heat resistance may not be obtained. In addition, when the a-axis length and the b-axis length are below the above range, the stress to be applied to the κ-aluminum oxide may become 1 GPa or more and the reliability of the memory device may be lowered.

For example, during the heat treatment after forming the MFS structure, it is possible to apply the stress to the ferroelectric layer 18 by rapid cooling from a high temperature to a low temperature. This stress makes it possible to shorten the a-axis length and the b-axis length of the κ-aluminum oxide.

The c-axis of the κ-aluminum oxide in the ferroelectric layer 18 is preferably oriented in the thickness direction of the ferroelectric layer 18. In other words, the c-axis of the κ-aluminum oxide is preferably oriented in the direction directing from the semiconductor layer 10 to the gate electrode 16. For example, the c-axis direction of the crystal grains of the κ-aluminum oxide are measured and the median value thereof is preferably within the range of ±10° with respect to the direction directing from the semiconductor layer 10 to the gate electrode 16 and is more preferably within the range of ±5°.

The c-axis of the κ-aluminum oxide in the ferroelectric layer 18 is preferably oriented in the thickness direction of the ferroelectric layer 18, so that a wide level of polarization state can be realized in the ferroelectric layer 18. Therefore, it is possible to realize a wide threshold voltage distribution in the memory cell. Therefore, multi-leveling of the memory cell is easily realized.

The thickness of the ferroelectric layer 18 is preferably more than or equal to 1 nm and less than or equal to 15 nm, and is more preferably more than or equal to 3 nm and less than or equal to 10 nm. When the thickness is below the above range, sufficient polarization may not be obtained. In addition, when the thickness exceeds the above range, it becomes difficult to scale down the memory cell.

In addition, the aluminum oxide has a wider band gap than hafnium oxide applied as the ferroelectric in the past. The band gap of ferroelectric the third orthorhombic hafnium oxide is calculated as only the degree of about 6 eV, the band gap of ferroelectric κ-aluminum oxide is calculated more than 8 eV depending on the inventors first principle calculation. The wider band gap gives the higher breakdown voltage. Therefore, the aluminum oxide has a higher dielectric breakdown voltage than the hafnium oxide. Therefore, the aluminum oxide is applied to the ferroelectric layer 18, so that a memory device with high reliability is realized.

The memory device according to the first embodiment preferably includes the interface layer 20. By providing the interface layer 20, it is possible to reduce the interface state between the semiconductor layer 10 and the gate insulating layer.

The aluminum oxide has a lower a relative dielectric constant than the hafnium oxide applied as the ferroelectric in the past. The relative dielectric constant of the aluminum oxide is about 8 to 9 and the hafnium oxide is about 15 to 25. Therefore, for example, when the memory device has the interface layer 20, it is possible to alleviate the electric field applied to the interface layer 20. Therefore, the dielectric breakdown of the interface layer 20 is suppressed. Therefore, a memory device with high reliability is realized.

As described above, according to the memory device according to the first embodiment, by providing the ferroelectric having the large coercive electric field and high dielectric breakdown voltage, it is easy to realize multi-leveling and high reliability.

Second Embodiment

A memory device according to a second embodiment includes a stacked body in which insulating layers and conductive layers are alternately stacked in a first direction, a semiconductor layer provided in the stacked body and extending in the first direction, and a first layer provided between at least one of the conductive layers and the semiconductor layer and containing aluminum oxide that contains at least one first element selected from the group consisting of magnesium (Mg), silicon (Si), hafnium (Hf), tungsten (W), and ruthenium (Ru) and is a ferroelectric.

The memory device according to the second embodiment is different from the memory device according to the first embodiment in that the same structure as a memory cell according to the first embodiment is applied to a three-dimensional NAND flash memory. For example, a ferroelectric layer is the same as in the first embodiment. Hereinafter, description of contents overlapping with those of the first embodiment will be partially omitted.

Figure 2:
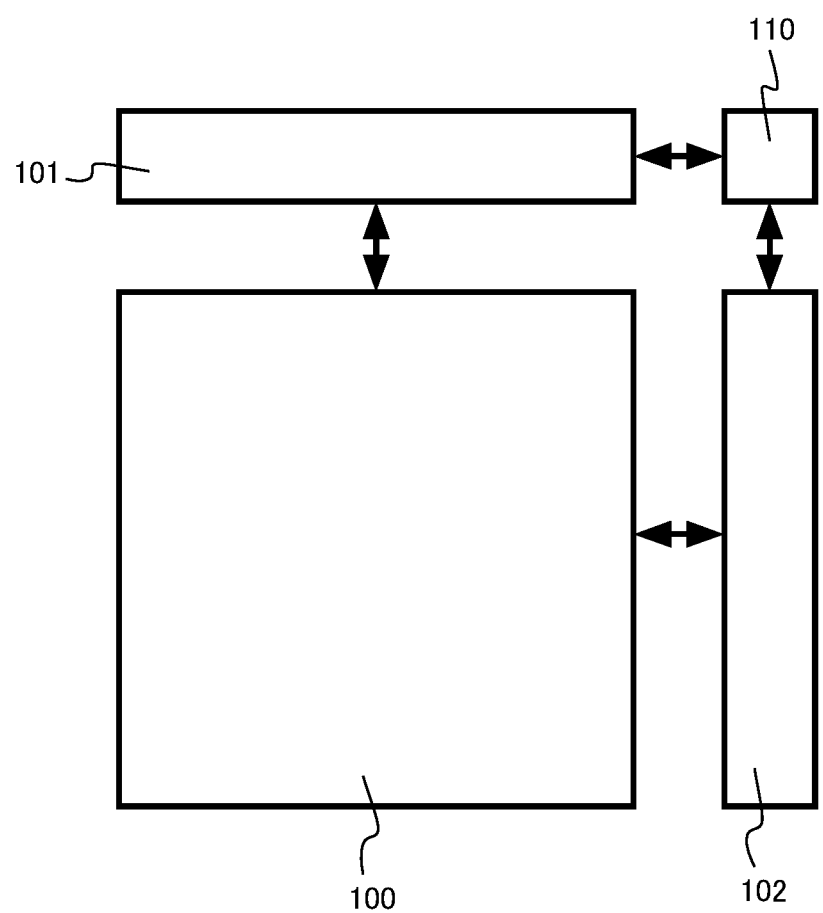
FIG. 2 is a block diagram of a memory device according to a second embodiment.
Figure 3:
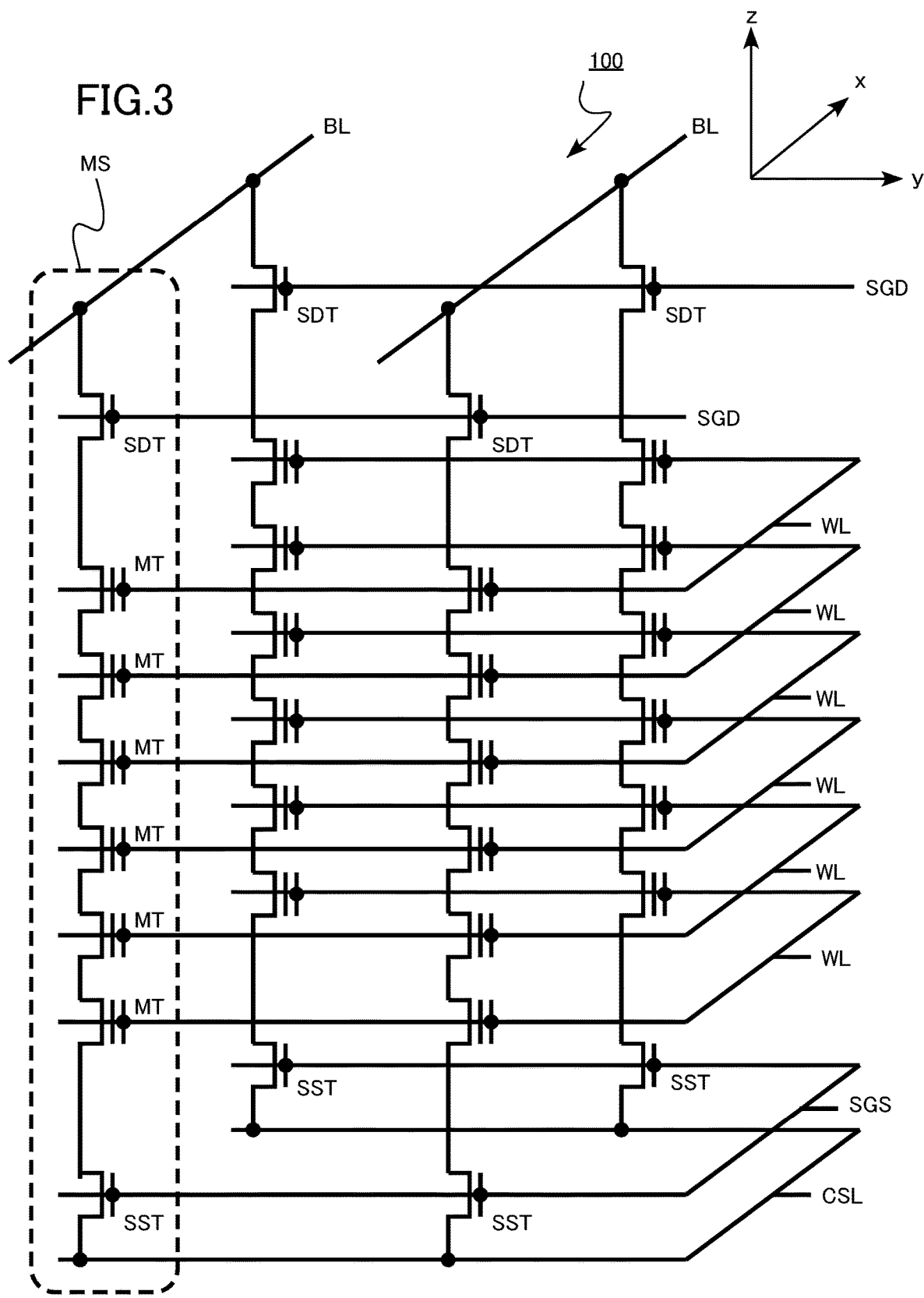
FIG. 3 is a circuit diagram of a memory cell array of the memory device according to the second embodiment.
Figure 4:
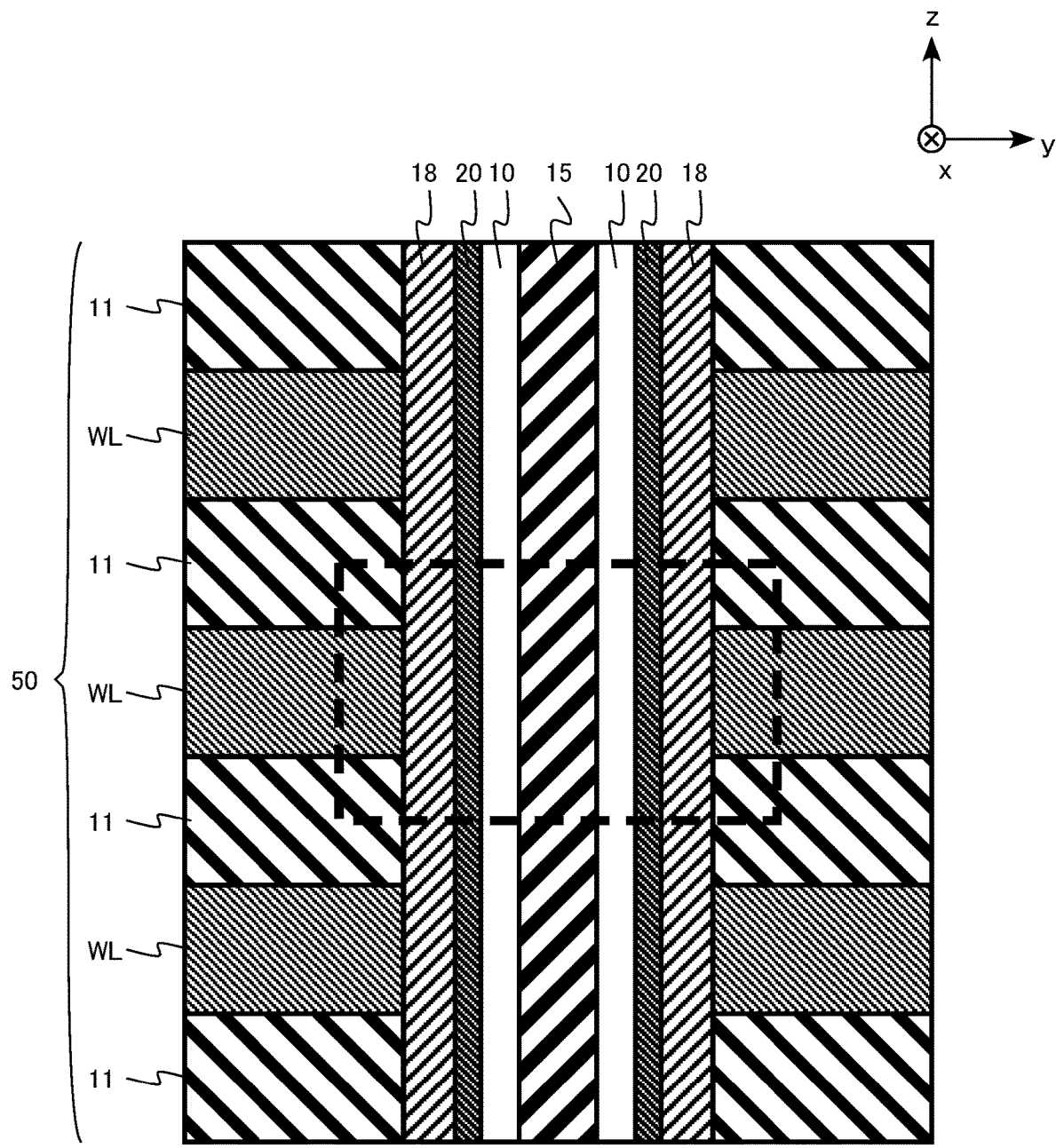
FIG. 4 is a schematic cross-sectional view of a memory string of the memory device according to the second embodiment.

FIG. 2 is a block diagram of the memory device according to the second embodiment. FIG. 3 is a circuit diagram of a memory cell array of the memory device according to the second embodiment. FIG. 4 is a schematic cross-sectional view of a memory string of the memory device according to the second embodiment. FIG. 4 shows cross-sections of a plurality of memory cell transistors MT in one memory string MS surrounded by, for example, a dotted line in a memory cell array 100 of FIG. 3. In FIG. 4, a region surrounded by the dotted line corresponds to one memory cell transistor MT.

The three-dimensional NAND flash memory includes the memory cell array 100, a first peripheral circuit 101, a second peripheral circuit 102, and a control circuit 110.

As shown in FIG. 3, the memory cell array 100 of the three-dimensional NAND flash memory according to the second embodiment includes a plurality of word lines WL, a common source line CSL, a source selection gate line SGS, a plurality of drain selection gate lines SGD, a plurality of bit lines BL, and a plurality of memory strings MS. In FIG. 3, an x direction (second direction), a y direction (third direction), and a z direction (first direction) are crossing directions, for example, orthogonal directions. The three-dimensional NAND flash memory according to the second embodiment has a so-called bit-cost scalable (BiCS) structure.

As shown in FIG. 3, the memory string MS includes a source selection transistor SST, a plurality of memory cell transistors MT, and a drain selection transistor SDT connected in series between the common source line CSL and the bit line BL. One memory string MS is selected by the bit line BL and the drain selection gate line SGD and one memory cell transistor MT can be selected by the word line WL.

As shown in FIG. 4, the memory cell array 100 includes a plurality of word lines WL (conductive layers), a semiconductor layer 10, a plurality of interlayer insulating layers 11 (insulating layers), a core insulating layer 15, a ferroelectric layer 18 (first layer), and an interface layer 20 (second layer). The word lines WL and the interlayer insulating layers 11 form a stacked body 50.

The word line WL and the interlayer insulating layer 11 are provided on a semiconductor substrate not shown in the drawings, for example.

The word line WL and the interlayer insulating layer 11 are alternately stacked in the z direction (first direction) on the semiconductor substrate. The word lines WL and the interlayer insulating layers 11 form a stacked body 50.

The word line WL is a plate-shaped conductor. The word line WL is, for example, a metal or a semiconductor. The word line WL is, for example, tungsten (W). The word line WL functions as a control electrode of the memory cell transistor MT. The word line WL is a gate electrode layer.

The interlayer insulating layer 11 separates the word line WL and the word line WL. The interlayer insulating layer 11 is, for example, silicon oxide.

The word line WL is an example of the conductive layer.

The core insulating layer 15 is provided in the stacked body 50. The core insulating layer 15 extends in the z direction. The core insulating layer 15 is provided to penetrate the stacked body 50. The core insulating layer 15 is surrounded by the semiconductor layer 10. The core insulating layer 15 is, for example, silicon oxide.

The semiconductor layer 10 is provided in the stacked body 50. The semiconductor layer 10 extends in the z direction. The semiconductor layer 10 is provided to penetrate the stacked body 50. The semiconductor layer 10 is provided around the core insulating layer 15. The semiconductor layer 10 has, for example, a cylindrical shape.

The semiconductor layer 10 is, for example, polycrystalline silicon, polycrystalline silicon germanium, polycrystalline indium gallium zinc oxide, or polycrystalline zinc tin oxide. The semiconductor layer 10 functions as a channel of the memory cell transistor MT.

The ferroelectric layer 18 is provided between the semiconductor layer 10 and the word line WL. The ferroelectric layer 18 functions as a part of a gate insulating layer.

The ferroelectric layer 18 contains ferroelectric aluminum oxide. The ferroelectric layer 18 contains ferroelectric aluminum oxide as a main component.

Aluminum oxide contains κ (kappa)-aluminum oxide. The κ-aluminum oxide is the ferroelectric.

The interface layer 20 is provided between the semiconductor layer 10 and the ferroelectric layer 18. The interface layer 20 functions as a part of the gate insulating layer. The interface layer 20 includes a paraelectric. The interface layer 20 has a function of reducing an interface state between the interface layer 20 and the semiconductor layer 10.

The memory cell transistor MT includes the word line WL, the ferroelectric layer 18, and the semiconductor layer 10. The memory cell transistor MT has a function of holding data based on a level of a polarization state of the ferroelectric layer 18.

The data held in the memory cell transistor MT is, for example, a threshold voltage of the memory cell transistor MT according to the level of the polarization state of the ferroelectric layer 18. The memory cell transistor MT can store data of two or more values using different threshold voltages, for example.

The bit line BL is electrically connected to the semiconductor layer 10. The bit line BL has a function of transmitting data read from the memory cell transistor MT. Further, the bit line BL has a function of transmitting data to be written to the memory cell transistor MT. The bit line BL is, for example, a metal.

The source selection transistor SST has a function of selecting the memory string MS on the basis of a signal applied to the source selection gate line SGS. The drain selection transistor SDT has a function of selecting the memory string MS on the basis of a signal applied to the drain selection gate line SGD.

For example, a ground potential is applied to the common source line CSL.

The first peripheral circuit 101 is connected to the word lines WL. The first peripheral circuit 101 has a function of selecting a desired word line WL. The first peripheral circuit 101 has a function of applying a commanded voltage to the selected word line.

The second peripheral circuit 102 is connected to the bit lines BL. The second peripheral circuit 102 has a function of selecting a desired bit line BL. In addition, the second peripheral circuit 102 has a function of sensing data of the memory cell transistor MT read from the selected bit line BL. In addition, the second peripheral circuit 102 has a function of transferring data to be written to the memory cell transistor MT to the selected bit line BL. The second peripheral circuit 102 includes, for example, a sense amplifier circuit.

The control circuit 110 controls an operation of the first peripheral circuit 101 and an operation of the second peripheral circuit 102. The control circuit 110 has a function of causing the first peripheral circuit 101 and the second peripheral circuit 102 to execute a write sequence, a read sequence, and an erasure sequence for the memory cell transistor MT.

As described above, according to the memory device according to the second embodiment, a ferroelectric having a large coercive electric field and high dielectric breakdown voltage is provided, so that it is easy to realize multi-leveling and high reliability. Further, a three-dimensional structure is provided, so that a memory capacity of the memory device can be increased.

Third Embodiment

A memory device according to a third embodiment is different from the memory device according to the first embodiment in that the memory device is a one-transistor one-capacitor type (1T1C type) memory device in which a capacitor having a ferroelectric layer as a dielectric layer and a transistor for memory cell selection are combined. For example, a ferroelectric layer is the same as in the first embodiment. Hereinafter, description of contents overlapping with those of the first embodiment will be partially omitted.

Figure 5:
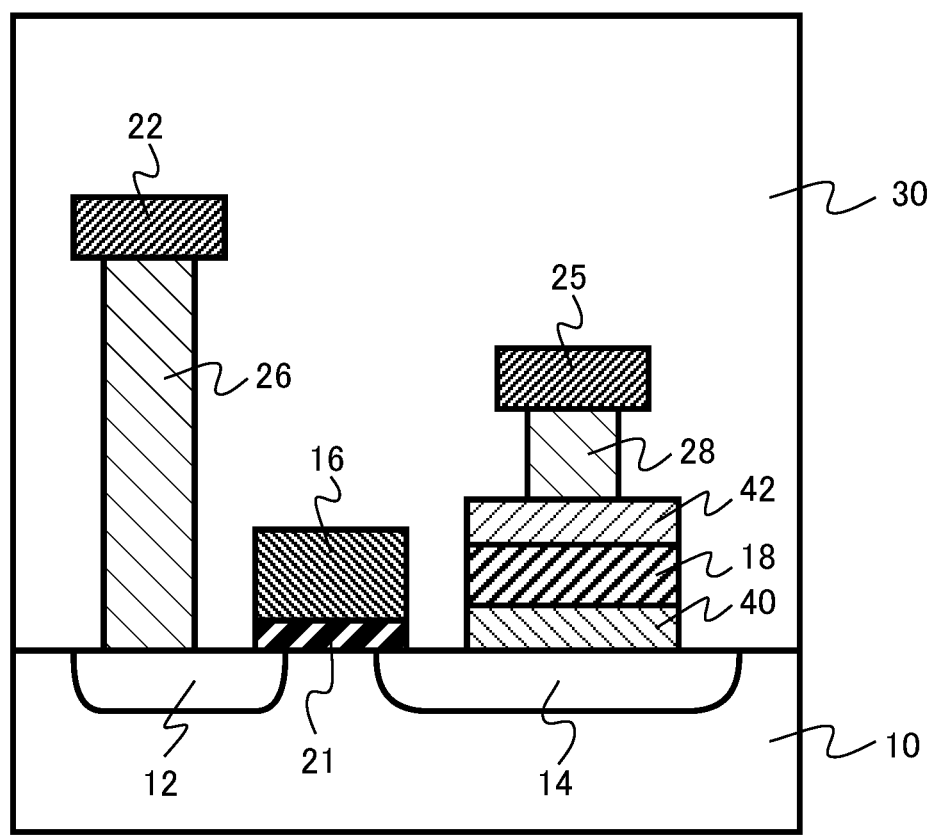
FIG. 5 is a schematic cross-sectional view of a memory device according to a third embodiment.

FIG. 5 is a schematic cross-sectional view of the memory device according to the third embodiment.

The memory device according to the third embodiment includes a semiconductor layer 10, a source region 12, a drain region 14, a gate electrode 16, a ferroelectric layer 18 (first layer), a gate insulating layer 21, a source line 22, a plate line 25, a first contact plug 26, a second contact plug 28, an interlayer insulating layer 30, a lower capacitor electrode 40 (first conductive layer), and an upper capacitor electrode 42 (second conductive layer).

The semiconductor layer 10 is, for example, single crystal silicon.

The source region 12 is provided in the semiconductor layer 10. The source region 12 is an n-type impurity region. The drain region 14 is provided in the semiconductor layer 10. The drain region 14 is an n-type impurity region.

The gate electrode 16 is a metal or a semiconductor. The gate electrode 16 is, for example, titanium nitride. The gate electrode 16 is, for example, polycrystalline silicon containing n-type impurities or p-type impurities.

The gate insulating layer 21 is provided between the semiconductor layer 10 and the gate electrode 16. The gate insulating layer 21 is, for example, silicon oxide.

The semiconductor layer 10, the gate insulating layer 21, the gate electrode 16, the source region 12, and the drain region 14 constitute the transistor for the memory cell selection. The gate electrode 16 functions as a word line of the memory device.

The ferroelectric layer 18 is provided between the lower capacitor electrode 40 and the upper capacitor electrode 42. The lower capacitor electrode 40, the upper capacitor electrode 42, and the ferroelectric layer 18 constitute a capacitor for storing memory data. The capacitor has a so-called a metal/ferroelectrics/metal (MFM) type structure.

The lower capacitor electrode 40 is provided on the drain region 14. The lower capacitor electrode 40 is electrically connected to the drain region 14.

The ferroelectric layer 18 contains ferroelectric aluminum oxide. The ferroelectric layer 18 contains ferroelectric aluminum oxide as a main component.

Aluminum oxide contains κ (kappa)-aluminum oxide. The κ-aluminum oxide is the ferroelectric.

The lower capacitor electrode 40 and the upper capacitor electrode 42 are formed of, for example, a conductive metal or a metal compound. The lower capacitor electrode 40 and the upper capacitor electrode 42 are, for example, titanium nitride (TiN).

The source line 22 is electrically connected to the source region 12 via the first contact plug 26. The plate line 25 is electrically connected to the upper capacitor electrode 42 via the second contact plug 28. The source line 22, the plate line 25, the first contact plug 26, and the second contact plug 28 are formed of, for example, a conductive metal or a metal compound.

The interlayer insulating layer 30 is provided to electrically isolate the semiconductor layer 10, the gate electrode 16, the source line 22, the plate line 25, the first contact plug 26, and the second contact plug 28. The interlayer insulating layer 30 is, for example, silicon oxide.

At the time of writing, the memory device according to the third embodiment changes a polarization direction of the ferroelectric layer 18 by selecting a memory cell by a word line and applying a voltage between the source line 22 and the plate line 25. For example, at the time of reading, the memory device applies a pulse voltage and determines data "1" or "0" according to whether or not an induced current by polarization inversion has been flown.

For example, the voltage applied between the source line 22 and the plate line 25 is controlled so that the ferroelectric maintains four or more polarization states with different levels. This makes it possible to realize multi-leveling in which a plurality of bits of data are stored in the ferroelectric layer 18 of the capacitor of the memory cell.

As described above, according to the memory device according to the third embodiment, a ferroelectric having a large coercive electric field and high breakdown voltage is provided, so that it is easy to realize multi-leveling or high reliability under a harsh environment.

Fourth Embodiment

A memory device according to a fourth embodiment is different from the memory device according to the first embodiment in that the memory device is a ferroelectric tunnel junction (FTJ) memory using an FTJ structure using a ferroelectric. For example, a ferroelectric layer is the same as in the first embodiment. Hereinafter, description of contents overlapping with those of the first embodiment will be partially omitted.

Figure 6:
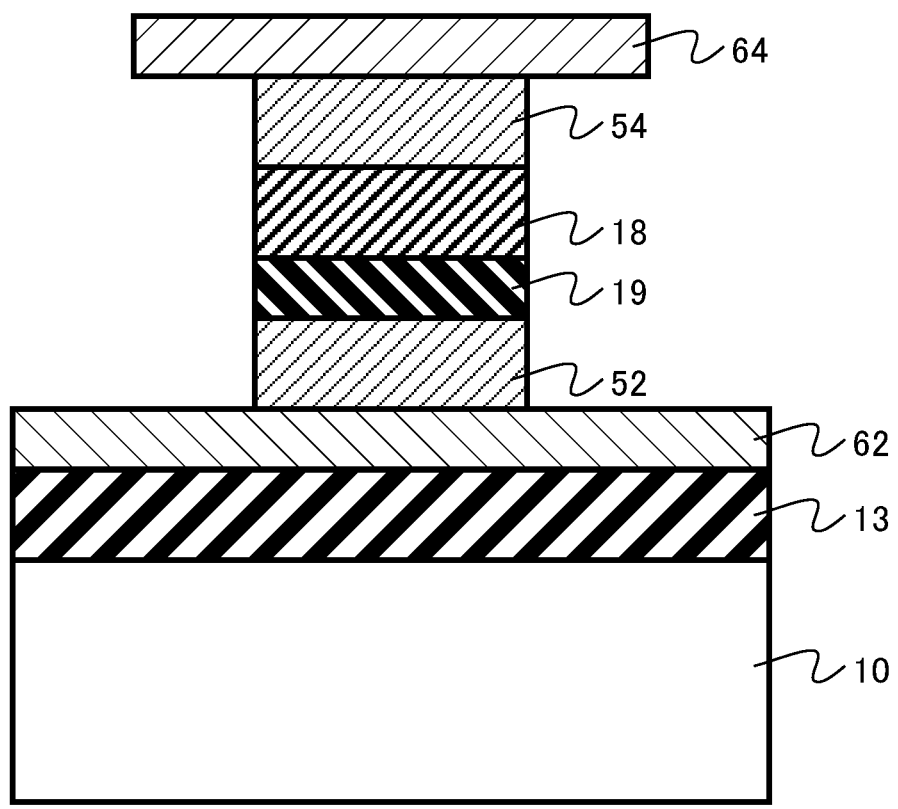
FIG. 6 is a schematic cross-sectional view of a memory device according to a fourth embodiment.

FIG. 6 is a schematic cross-sectional view of the memory device according to the fourth embodiment.

The memory device according to the fourth embodiment includes a semiconductor layer 10, an insulating layer 13, a ferroelectric layer 18 (first layer), a paraelectric layer 19, a lower electrode 52 (first conductive layer), an upper electrode 54 (second conductive layer), a first electrode wiring line 62, and a second electrode wiring line 64.

The semiconductor layer 10 is, for example, single crystal silicon.

The insulating layer 13 is provided on the semiconductor layer 10. The insulating layer 13 is, for example, silicon oxide.

The ferroelectric layer 18 is provided between the lower electrode 52 and the upper electrode 54. The paraelectric layer 19 is provided between the lower electrode 52 and the ferroelectric layer 18.

The ferroelectric layer 18 contains ferroelectric aluminum oxide. The ferroelectric layer 18 contains ferroelectric aluminum oxide as a main component.

Aluminum oxide contains κ (kappa)-aluminum oxide. The κ-aluminum oxide is the ferroelectric.

The paraelectric layer 19 includes a paraelectric. The paraelectric is, for example, oxide or oxynitride. The paraelectric is, for example, silicon oxide.

The lower electrode 52 and the upper electrode 54 are formed of, for example, a conductive metal or a metal compound. For example, the lower electrode 52 and the upper electrode 54 are titanium nitride (TiN).

The first electrode wiring line 62 is provided between the insulating layer 13 and the lower electrode 52. The first electrode wiring line 62 contacts the lower electrode 52.

The second electrode wiring line 64 is provided on the upper electrode 54. The second electrode wiring line 64 contacts the upper electrode 54.

The FTJ memory includes a two-terminal FTJ structure sandwiched between the first electrode wiring line 62 and the second electrode wiring line 64. The FTJ structure functions as a memory cell by using a change in the current amount of a tunnel current according to polarization inversion of the ferroelectric.

The memory cell is provided in a region where the first electrode wiring line 62 and the second electrode wiring line 64 intersect. The FTJ memory according to the fourth embodiment includes a so-called cross point structure.

In the FTJ memory according to the fourth embodiment, at the time of data writing, a voltage is applied between the first electrode wiring line 62 and the second electrode wiring line 64 to invert the polarization of the ferroelectric layer 18. Further, at the time of data reading, data of the memory cell is read as an amount of current flowing between the first electrode wiring line 62 and the second electrode wiring line 64. By determining the amount of current depending on a polarization direction of the ferroelectric layer 18, the polarity of the data is determined. For example, data "0" or "1" is determined.

Since a coercive electric field of the ferroelectric of the ferroelectric layer 18 is high, the polarization state of the ferroelectric layer 18 hardly changes. Therefore, an operation of the FTJ memory is stabilized.

As described above, according to the memory device according to the fourth embodiment, the ferroelectric having the large coercive electric field and high breakdown voltage is provided, so that the stable operation can be realized.

For example, the present disclosure can be applied to a memory device having a three-dimensional structure, such as P-BiCS (pipe-shaped bit-cost scalable), TCAT (terabit cell array transistor), VG (vertical gate)-NAND, VC (vertical channel)-NAND, cross-point-NAND, VSAT (vertical stacked array transistor), VRAT (vertical-recess-array-transistor), VG-TFT (vertical gate-thin film transistor)-NAND, DC-SF (dual control-gate with surrounding floating-gate), PNVG (PN diode decoded vertical gate), Hybrid 3D (hybrid stacked 3d), Si Pillar 3D NAND, Stacked NAND, and Multi TFT S-SGT (stacked-surrounding gate transistor).

Also, a structure in which the FTJ structures shown in the fourth embodiment are stacked in multiple stages can be adopted. By stacking the FTJ structures in the multiple stages, a degree of integration of the memory device is improved.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
   a first conductive layer;
   a second conductive layer; and
   a first layer provided between the first conductive layer and the second conductive layer, the first layer including aluminum oxide, the aluminum oxide containing ruthenium (Ru), and the aluminum oxide being a ferroelectric.

2. The memory device according to claim 1, wherein a thickness of the first layer is more than or equal to 1 nm and less than or equal to 15 nm.

3. The memory device according to claim 1, wherein a c-axis direction of the aluminum oxide in the first layer is within a range of ±10° with respect to a direction from the first conductive layer to the second conductive layer.

4. The memory device according to claim 1, further comprising a second layer provided between the first conductive layer and the first layer, the second layer containing at least one of oxide and oxynitride.

5. The memory device according to claim 1, wherein the first conductive layer is a semiconductor layer.

6. A memory device comprising:
   a first conductive layer;
   a second conductive layer; and
   a first layer provided between the first conductive layer and the second conductive layer, the first layer including aluminum oxide, the aluminum oxide containing at least one first element selected from the group consisting of magnesium (Mg), silicon (Si), hafnium (Hf), tungsten (W), and ruthenium (Ru), and the aluminum oxide being a ferroelectric,
   wherein the aluminum oxide contains at least one second element selected from the group consisting of manganese (Mn), chromium (Cr), and cobalt (Co).

7. The memory device according to claim 6, wherein the first conductive layer is a semiconductor layer.

8. A memory device comprising:
   a first conductive layer;
   a second conductive layer; and
   a first layer provided between the first conductive layer and the second conductive layer, the first layer including aluminum oxide, the aluminum oxide containing at least one first element selected from the group consisting of magnesium (Mg), silicon (Si), hafnium (Hf), tungsten (W), and ruthenium (Ru), and the aluminum oxide being a ferroelectric, wherein the aluminum oxide contains at least one second element selected from the group consisting of sulfur (S) and chlorine (Cl).

9. The memory device according to claim 8, wherein the first conductive layer is a semiconductor layer.

10. A memory device comprising:
a first conductive layer;
a second conductive layer; and
a first layer provided between the first conductive layer and the second conductive layer, the first layer including aluminum oxide, the aluminum oxide containing ruthenium (Ru), and the aluminum oxide being κ (kappa)-aluminum oxide.

11. The memory device according to claim 10, wherein a thickness of the first layer is more than or equal to 1 nm and less than or equal to 15 nm.

12. The memory device according to claim 10, wherein a c-axis direction of the aluminum oxide in the first layer is within a range of ±10° with respect to a direction from the first conductive layer to the second conductive layer.

13. The memory device according to claim 10, further comprising a second layer provided between the first conductive layer and the first layer, the second layer containing at least one of oxide and oxynitride.

14. The memory device according to claim 10, wherein the first conductive layer is a semiconductor layer.

15. A memory device comprising:
a first conductive layer;
a second conductive layer; and
a first layer provided between the first conductive layer and the second conductive layer, the first layer including aluminum oxide, the aluminum oxide containing at least one first element selected from the group consisting of magnesium (Mg), silicon (Si), hafnium (Hf), tungsten (W), and ruthenium (Ru), the aluminum oxide being κ (kappa)-aluminum oxide, wherein an a-axis length of the aluminum oxide is 97% or more and 99.5% or less of a standard a-axis length, and a b-axis length of the aluminum oxide is 97% or more and 99.5% or less of a standard b-axis length, the standard a-axis length and the standard b-axis length of the aluminum oxide being an a-axis length and a b-axis length of κ-aluminum oxide described in an International Center for Diffraction Data (ICDD) database.

16. The memory device according to claim 15, wherein a c-axis direction of the aluminum oxide in the first layer is within a range of ±10° with respect to a direction from the first conductive layer to the second conductive layer.

17. The memory device according to claim 11, wherein the first conductive layer is a semiconductor layer.

18. A memory device comprising:
a first conductive layer;
a second conductive layer; and
a first layer provided between the first conductive layer and the second conductive layer, the first layer including aluminum oxide, the aluminum oxide containing at least one first element selected from the group consisting of magnesium (Mg), silicon (Si), hafnium (Hf), tungsten (W), and ruthenium (Ru), and the aluminum oxide being κ (kappa)-aluminum oxide, wherein the aluminum oxide contains at least one second element selected from the group consisting of manganese (Mn), chromium (Cr), and cobalt (Co).

19. The memory device according to claim 12, wherein the first conductive layer is a semiconductor layer.

20. A memory device comprising:
a first conductive layer;
a second conductive layer; and
a first layer provided between the first conductive layer and the second conductive layer, the first layer including aluminum oxide, the aluminum oxide containing at least one first element selected from the group consisting of magnesium (Mg), silicon (Si), hafnium (Hf), tungsten (W), and ruthenium (Ru), and the aluminum oxide being κ (kappa)-aluminum oxide, wherein the aluminum oxide contains at least one second element selected from the group consisting of sulfur (S) and chlorine (Cl).

21. The memory device according to claim 20, wherein the first conductive layer is a semiconductor layer.

* * * * *